(12) United States Patent
Chiang et al.

(10) Patent No.: US 7,180,161 B2
(45) Date of Patent: Feb. 20, 2007

(54) LEAD FRAME FOR IMPROVING MOLDING RELIABILITY AND SEMICONDUCTOR PACKAGE WITH THE LEAD FRAME

(75) Inventors: Lien-Chen Chiang, Taichung Hsien (TW); Wei-Sheng Lin, Taichung Hsien (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 11/039,432

(22) Filed: Jan. 19, 2005

(65) Prior Publication Data

US 2006/0006505 A1    Jan. 12, 2006

(30) Foreign Application Priority Data

Jul. 8, 2004    (TW) .............. 93120424 A

(51) Int. Cl.
*H01L 23/495*    (2006.01)
*H01L 23/02*    (2006.01)
*H01L 23/20*    (2006.01)
*H01L 23/06*    (2006.01)

(52) U.S. Cl. .............. 257/666; 257/676; 257/780; 257/781; 257/782; 257/784; 257/E33.066; 257/E23.039

(58) Field of Classification Search .............. None
See application file for complete search history.

(56) References Cited

U.S. PATENT DOCUMENTS

| | | | |
|---|---|---|---|
| 5,132,772 A * | 7/1992 | Fetty ..................... 257/779 |
| 5,960,262 A | 9/1999 | Torres et al. |
| 6,018,189 A * | 1/2000 | Mizuno ................ 257/668 |
| 6,025,640 A * | 2/2000 | Yagi et al. ............ 257/666 |
| 6,208,020 B1 | 3/2001 | Minamio et al. |
| 6,310,395 B1 * | 10/2001 | Takahashi et al. .... 257/735 |
| 6,338,984 B2 | 1/2002 | Minamio et al. |
| 6,713,849 B2 * | 3/2004 | Hasebe et al. ........ 257/667 |
| 2002/0027297 A1 * | 3/2002 | Ikenaga et al. ....... 257/784 |

* cited by examiner

*Primary Examiner*—Jasmine Clark
(74) *Attorney, Agent, or Firm*—Peter F. Corless; Steven M. Jenson; Edwards Angell Palmer & Dodge LLP

(57) ABSTRACT

A lead frame for improving molding reliability and a semiconductor package with the lead frame are proposed. At least one embossed structure, such as a metal bump or recessed portion, is formed on a bonding layer of a wire-bonding area of the lead frame. At least one semiconductor chip is electrically connected to the lead frame via bonding wires bonded to the bonding layer. During a molding process for fabricating an encapsulant to encapsulate the chip, the bonding wires and a portion of the lead frame, the embossed structure makes the bonding layer become uneven and thus increases the contact area and adhesion between the bonding layer and the encapsulant, so as to prevent cracks of the bonding wires and improve the electrical performances and molding reliability.

20 Claims, 5 Drawing Sheets

LEAD FRAME FOR IMPROVING MOLDING RELIABILITY AND SEMICONDUCTOR PACKAGE WITH THE LEAD FRAME

FIELD OF THE INVENTION

The present invention relates to lead frames for improving molding reliability and semiconductor packages thereof, and more particularly, to a lead frame for improving reliability of bonding wires formed between a chip and the lead frame, and a semiconductor package with the lead frame.

BACKGROUND OF THE INVENTION

Conventionally, a semiconductor chip is usually mounted on a lead frame serving as a chip carrier to form a semiconductor package. The lead frame comprises a die pad and a plurality of leads surrounding the die pad, such that the chip is attached to the die pad and is electrically connected to the leads via a plurality of bonding wires. And an encapsulant is formed to encapsulate the chip, the die pad, the bonding wires, and inner portions of the leads. This completes the semiconductor package with the lead frame.

There have been developed various types of semiconductor packages using lead frames as chip carriers, such as quad flat package (QFP), quad-flat non-leaded (QFN) package, small outline package (SOP), and dual in-line package (DIP), etc. In order to improve the heat dissipating efficiency and satisfy the size requirement of a small chip scale package (CSP), the QFN package with a die pad having an exposed bottom surface or an exposed-pad semiconductor package has become a mainstream package structure.

Moreover, for further improving the electrical performances of the conventional lead-frame-based semiconductor package, besides electrically connecting the semiconductor chip to the leads via signal wires, ground pads on the chip can be electrically connected to the die pad of the lead frame via ground wires in a down-bonding manner. In other words, the lead frame provides the leads and a peripheral area of the die pad as wire-bonding regions for electrically connecting the bonding wires.

When the chip is electrically connected to the lead frame, since the lead frame is primarily made of copper and the bonding wires are primarily made of gold that has poor bondability with copper, a silver layer is usually in advance plated on the wire-bonding regions (such as the leads) of the lead frame, such that an eutectic structure is formed by the gold bonding wires and the silver layer on the wire-bonding regions during the wire-bonding process, and thus the bonding wires are bonded and connected to the lead frame. However, due to the weak adhesion between the silver layer and the encapsulant, it is easy to cause delamination therebetween by thermal stress in subsequent fabrication processes and even cause wire cracks or breakage.

Particularly for the QFN semiconductor package, it is characterized in not having outer leads that are used to establish external electrical connection in the conventional quad flat package (QFP), and thus the size of the QFN package can be relatively reduced. As shown in FIG. 1A of the QFN semiconductor package 1, bottom surfaces of a die pad 11 and leads 12 of a lead frame 10 are all exposed from an encapsulant 15, such that heat generated by a semiconductor chip 13 that is mounted on the die pad 11 and electrically connected to the leads 12 via bonding wires 14 can be effectively dissipated out of the QFN semiconductor package 1, and also the QFN semiconductor package 1 can be directly electrically connected to an external device such as a printed circuit board (not shown) via the exposed surfaces of the leads 12.

As shown in FIGS. 1B and 1C that are partial enlarged views of a bonding wire 14 for electrically connecting the semiconductor chip to the lead frame, since only one surface of the QFN lead frame is encapsulated by the encapsulant 15, during a molding process, delamination would be easily incurred between the encapsulant 15 and the silver layer on the lead 12 due to thermal stress, thereby leading to cracks or breakage of the bonding wire 14 and degrading the package reliability.

In light of the foregoing drawbacks, U.S. Pat. Nos. 6,208,020, 6,338,984, and 6,483,178 have proposed a structure with grooves or holes being formed on the leads of the lead frame to improve the adhesion between the lead frame and the encapsulant.

A lead-frame-based semiconductor package disclosed in U.S. Pat. No. 6,483,178 is shown in FIG. 2. This semiconductor package is a QFN package 2 comprising a die pad 21 having an exposed bottom surface; a chip 23 attached to the die pad 21; a plurality of leads 22 formed around the die pad 21; bonding wires 24 connected between the chip 23 and the leads 22; and an encapsulant 25 for encapsulating the leads 22, the chip 23, the bonding wires 24, and the die pad 21, wherein the bottom surface of the die pad 21 and bottom and outer surfaces of the leads 22 are exposed from the encapsulant 25. A characteristic feature of this semiconductor package 2 is to form at least one bolt hole 26a in each of the leads 22 and allow the encapsulant 25 to fill the bolt holes 26a. Each of the bolt holes 26a comprises two cylindrical holes 261a, 262a, wherein the upper cylindrical hole 261a has smaller axial coverage than the lower cylindrical hole 262a. This difference in coverage allows the encapsulant 25 filling the bolt holes 26a to be firmly engaged with the leads 22, such that the leads 22 are strongly fixed in the encapsulant 25.

In accordance with the development of light-weight and small-profile electronic devices, a fine-pitch and small-size lead frame has been widely used. However, there is no sufficient area on small leads of such lead frame to accommodate grooves or holes, and the grooves and holes are also difficult to be fabricated. Moreover, the rigidity of the small leads would be undesirably reduced with the grooves or holes being formed thereon, making bonding wires hard to be bonded to the leads. Conventionally, the grooves or holes are formed outside wire-bonding areas of the leads and thus not effective to solve the problem of delamination between the silver layer on the wire-bonding areas and the encapsulant.

U.S. Pat. No. 5,960,262 has disclosed a wire-bonding method for reinforcing a bonding structure by forming a stud bond over a stitch bond of a bonding wire. This wire-bonding method is shown in FIGS. 3A to 3F.

First referring to FIGS. 3A and 3B, a wire bonder is prepared, which comprises a capillary 34 for accommodating a gold wire (bonding wire) 32, and a damper 36 for clamping and releasing the gold wire 32. A free air ball (FAB) is formed at a front end of the gold wire 32 in the capillary 34 by a conventional ball-sintering process and is pressed on a corresponding input/output (I/O) pad 300 of a semiconductor chip so as to form a ball bond (generally referred to as a first bond) bonded to the I/O pad 300. Then referring to FIG. 3C, the capillary 34 is moved to draw the gold wire 32 to a lead 31 of a lead frame to form a stitch bond (generally referred to as a second bond) on a predetermined position of the lead 31, and then the gold wire 32 is cut from the capillary 34. Subsequently referring to FIGS. 3D to 3F, a stud bond 37 made of the same material as the gold wire 32 is implanted on the stitch bond so as to reinforce the bonding strength between the stitch bond and the lead 31.

However, the provision of stud bond on the second bond (stitch bond) can only enhance the bonding strength between the second bond and the lead frame, such that a neck portion of the gold wire near the second bond becomes relatively weaker in structural strength and is easily subject to cracks. Moreover, highly precise movement of the capillary is required to form the stud bond. This undesirably prolongs the fabrication time, increases the fabrication cost, and causes difficulty in fabrication. Furthermore, during cutting the gold wire after the stud bond is formed, a cutting position of the gold wire depends on the movement of capillary and is not easily controlled. This causes a portion of the gold wire remaining on the capillary to be varied in length, and thus affects the shape of FAB fabricated by the next ball-sintering process and makes the size of the ball bond not uniformed.

Therefore, the problem to be solved here is to provide a semiconductor package with a lead frame, which can overcome the above drawbacks in the prior art.

SUMMARY OF THE INVENTION

In light of the drawbacks in the prior art, a primary objective of the present invention is to provide a lead frame for improving molding reliability and a semiconductor package with the lead frame, so as to prevent delamination or cracks at a wire-bonded position caused by thermal stress generated between the lead frame and an encapsulant, and assure good electrical connection for the wire-bonded position.

Another objective of the present invention is to provide a lead frame for improving molding reliability and a semiconductor package with the lead frame, which can use a conventional wire-bonding process without having to accurately control precision in fabrication, and can also shorten the wire-bonding time and improve the molding reliability between an encapsulant and the lead frame.

A further objective of the present invention is to provide a lead frame for improving molding reliability and a semiconductor package with the lead frame, which can stabilize a ball-sintering process every time to form a ball bond having a uniform shape without having to control precision of movement of a wire bonder, and can also improve the molding reliability between an encapsulant and the lead frame.

In order to achieve the foregoing and other objectives, the present invention proposes a lead frame for improving molding reliability, comprising: a die pad; a plurality of leads formed around the die pad; and a bonding layer disposed on each of wire-bonding areas of the lead frame, wherein at least one embossed structure is formed on at least one of the bonding layers at a position not for wire bonding. The lead frame is primarily made of copper metal, and the wire-bonding areas of the lead frame include inner portions of the leads and/or a peripheral portion of the die pad. The bonding layer is a metallic layer made of silver, nickel/palladium, etc. The embossed structure formed on the bonding layer may comprise a metal bump implanted on the bonding layer, or a recessed portion formed in the bonding layer. The embossed structure makes the bonding layer become uneven and thus enhances the adhesion between the bonding layer and a subsequent encapsulant, so as to prevent the occurrence of delamination.

The present invention also proposes a semiconductor package with a lead frame for improving molding reliability, comprising: a lead frame having a die pad, a plurality of leads formed around the die pad, and a bonding layer disposed on each of wire-bonding areas of the lead frame, wherein at least one embossed structure is formed on at least one of the bonding layers at a position not for wire bonding; at least one semiconductor chip mounted on the die pad; a plurality of bonding wires for electrically connecting the semiconductor chip to the wire-bonding areas of the lead frame; and an encapsulant for encapsulating the chip, the bonding wires and a portion of the lead frame.

Therefore, in the lead frame for improving molding reliability and the semiconductor package with the lead frame according to the present invention, embossed structures such as metal bumps or recessed portions are formed on bonding layers that are disposed on wire-bonding areas of the lead frame and where bonding wires are to be bonded. During a subsequent molding process for fabricating an encapsulant to encapsulate the chip, the bonding wires and a portion of the lead frame, the embossed structures of the bonding layers increase the contact area and adhesion between the bonding layers and the encapsulant, such that delamination between the bonding layers and the encapsulant and cracks of the bonding wires can be prevented, and the electrical performances and molding reliability are both improved. In another aspect, compared to the prior art of forming grooves or holes on the leads of the lead frame, the present invention fabricates the embossed structures on the bonding layers of the wire-bonding areas of the lead frame to enhance the adhesion between the lead frame and the encapsulant without having to form grooves or holes on the leads having small areas. As a result, the present invention effectively avoids the problems such as reduction in rigidity of the leads, increase of difficulty in fabrication and wire bonding, and delamination between the bonding layers of the wire-bonding areas and the encapsulant. Compared to the conventional stud-bonding technique, the present invention is advantageously not necessary to control precision of movement of a wire bonder, such that the problems caused by imprecise movement control, such as failure in forming a uniform ball shape and variation in length of a remaining wire portion on a capillary of the wire bonder, can be avoided. Moreover, the present invention does not require an unique set of parameters for controlling the ball shape, thereby making the fabrication processes smooth, and the present invention also eliminates the prior-art drawback of cracks at the neck portion of the bonding wire near the second bond (stitch bond).

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

The preferred embodiments of a lead frame and a semiconductor package with the lead frame proposed in the present invention are described in detail with reference to FIGS. 4 to 6. The lead frame suitable for a quad flat non-leaded (QFN) package is exemplified herein but does not set a limitation to the present invention; it should be understood that the lead frame in the present invention can be applied to other package structures. Moreover in the following embodiments, the drawings merely show the elements or structures relevant to the present invention. The number, size and arrangement of elements should be more complex in practice.

Figure 1A:
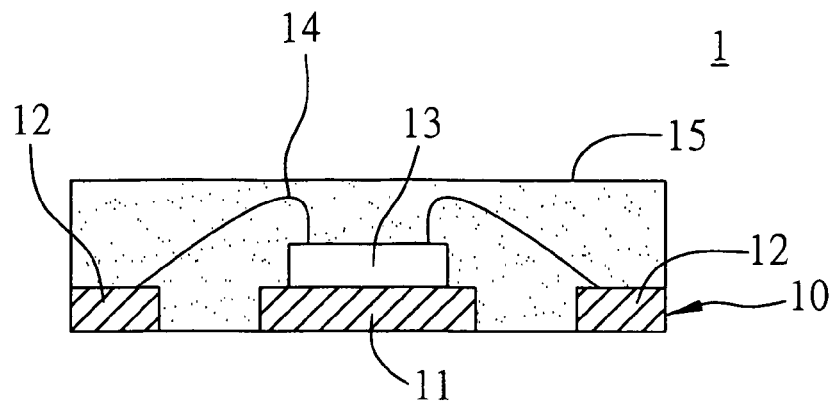
FIG. 1A (PRIOR ART) is a cross-sectional view of a convention QFN semiconductor package.
Figures 1B, 1C:
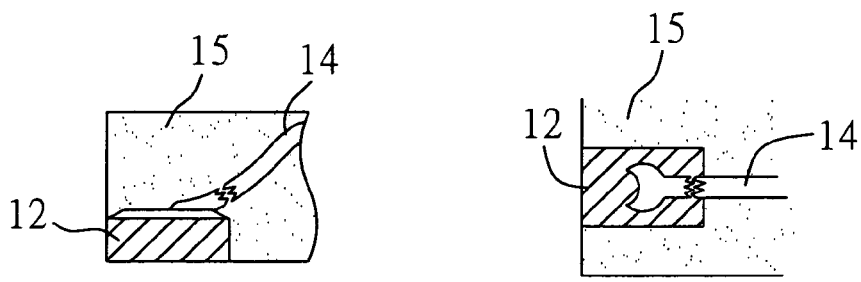
FIG. 1B (PRIOR ART) is a partial cross-sectional view showing delamination and cracks of a bonding wire in the conventional QFN package.
FIG. 1C (PRIOR ART) is a partial top view showing delamination and cracks of the bonding wire in the conventional QFN package.
Figure 2:
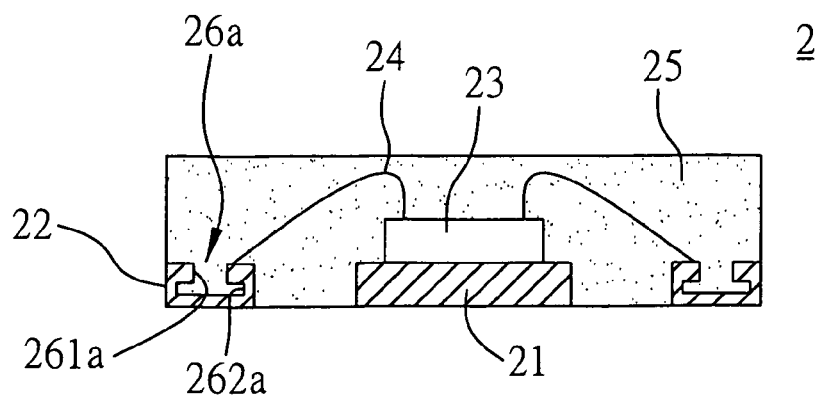
FIG. 2 (PRIOR ART) is a cross-sectional view of a semiconductor package disclosed in U.S. Pat. No. 6,483,178 with holes being formed in leads of a lead frame.
Figure 3A:
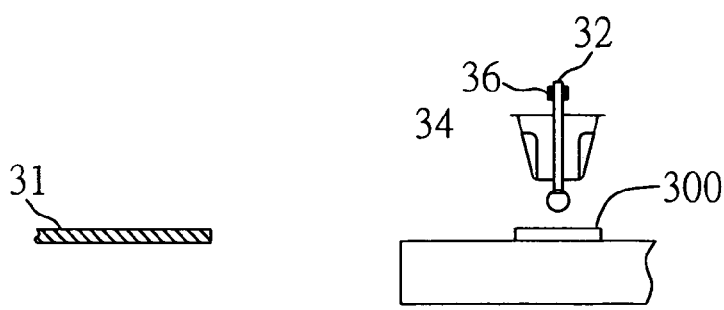
FIGS. 3A to 3F (PRIOR ART) are schematic diagrams showing processes of a wire-bonding method for reinforcing a bonding structure by forming a stud bond on a stitch bond in accordance with U.S. Pat. No. 5,960,262.
Figure 3B:
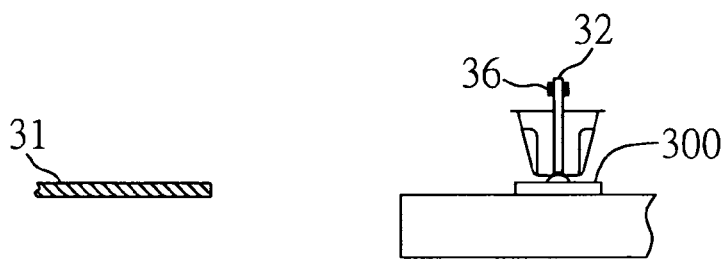
Figure 3C:
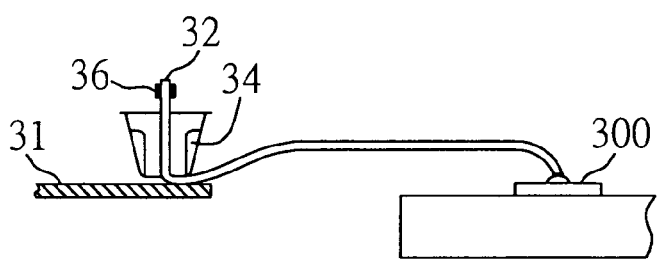
Figure 3D:
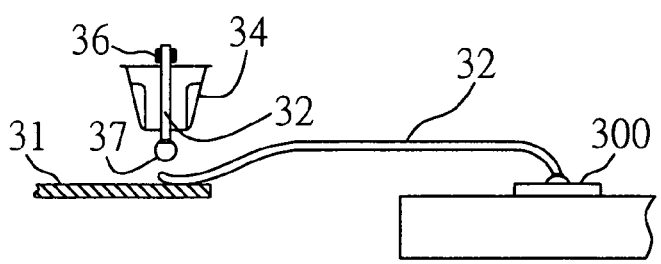
Figure 3E:
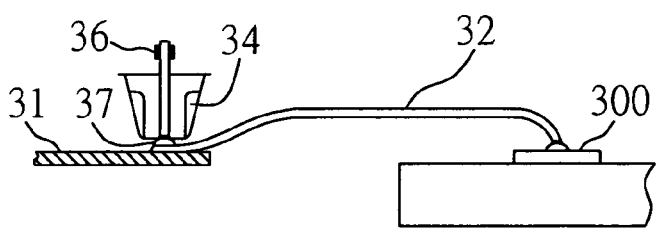
Figure 3F:
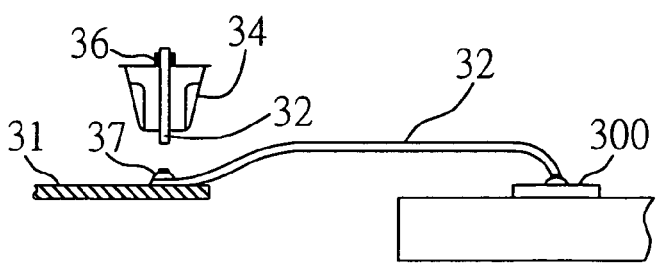
Figure 4A:
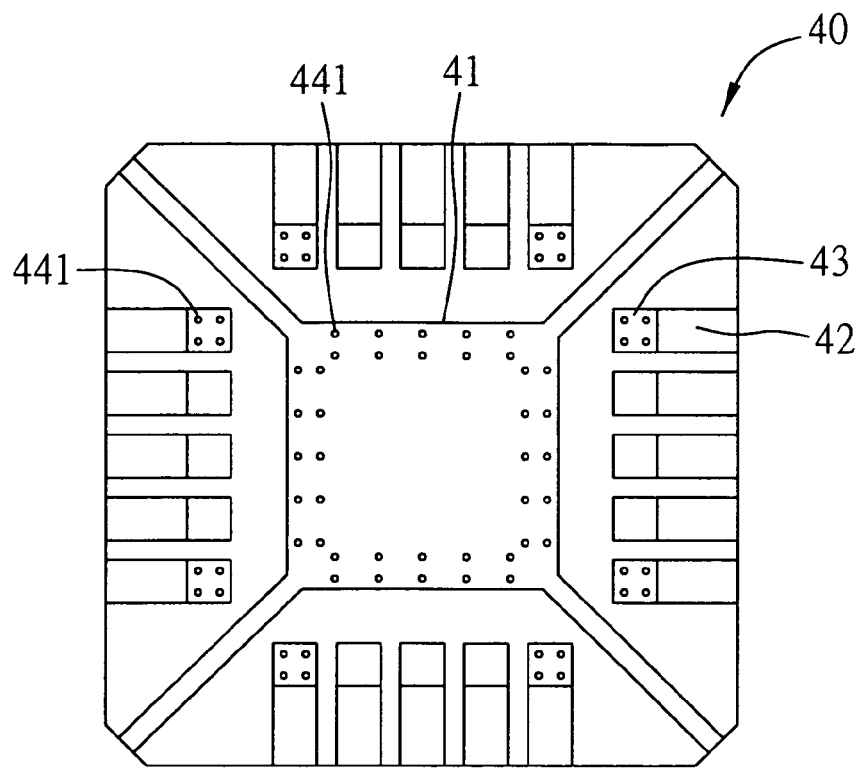
FIGS. 4A and 4B are schematic diagrams of a lead frame in accordance with a first preferred embodiment of the present invention.
Figure 4B:
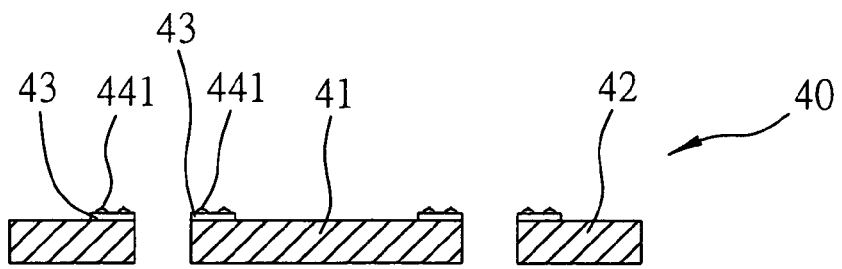

Referring to FIGS. 4A and 4B, the lead frame 40 for improving molding reliability according to a first preferred embodiment of the present invention comprises: a die pad 41; a plurality of leads 42 formed around the die pad 41; and a bonding layer 43 disposed on each of wire-bonding areas of the lead frame 40, wherein at least one embossed structure such as a metal bump 441 is formed on at least one of the bonding layers 43 at a position not for wire bonding. The embossed structure can be optionally mounted on some or all of the bonding layers 43 of the lead frame 40. For example, the embossed structure may be formed on the bonding layers 43 that would possibly suffer more thermal stress, such as the bonding layers 43 on the leads 42 located at corners of the lead frame 40 and on corner positions of the die pad 41, so as to provide better adhesion between the bonding layers 43 of the lead frame 40 and an encapsulant.

The wire-bonding areas of the lead frame 40 include inner portions of the leads 42 and a peripheral portion of the die pad 41. When a chip is subsequently mounted on the die pad 41, the chip can be electrically connected to the leads 42 via signal wires, and ground pads on the chip can be electrically connected via ground wires to a grounding region defined in the peripheral portion of the die pad 41 of the lead frame 40 not occupied by the chip. The lead frame is primarily made of copper metal, and the bonding layer is a metallic layer made of silver, nickel/palladium, etc. When bonding wires (e.g. gold wires) are fabricated to establish electrical connection between the chip and the lead frame, the bonding wires (gold) and the bonding layers (silver) of the wire-bonding areas of the lead frame form an eutectic structure, such that the bonding wires can be bonded and electrically connected to the lead frame.

Figure 4C:
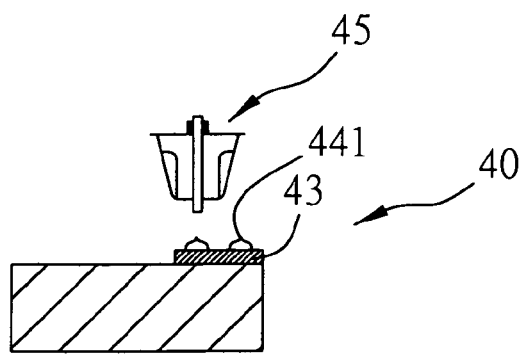
FIG. 4C is a schematic diagram showing a metal bump being mounted on a bonding layer of a wire-bonding area of the lead frame in accordance with the present invention.

Referring to FIG. 4C, the embossed structure formed on at least one of the bonding layers 43 of the wire-bonding area of the lead frame 40 may include a metal bump 441 implanted on the bonding layer 43, wherein the metal bump 441 is formed by using a wire bonder 45 to implant a gold stud made of the same material as the bonding wires. The provision of metal bump 441 makes the bonding layer 43 form an uneven structure for enhancing the adhesion between the bonding layer 43 and the encapsulant, so as to prevent delamination and wire cracks caused by insufficient adhesion between the bonding layer 43 and the encapsulant.

In this embodiment, an electric flame-off (EFO) device can be mounted at a capillary of the wire bonder to discharge high voltage (about 400 volts) and sinter a free air ball (FAB) at a front end of the bonding wire. Then, the capillary is moved to press the FAB on the bonding layer, allowing the FAB connected with the bonding wire to be bonded to the bonding layer. When the FAB comes into contact with the bonding layer, the capillary of the wire bonder would exert a downward force of about 100 g and produce ultrasonic waves at a frequency of approximately 60–120 kHz so as to melt and bond the FAB to the bonding layer by friction.

Figure 5A:
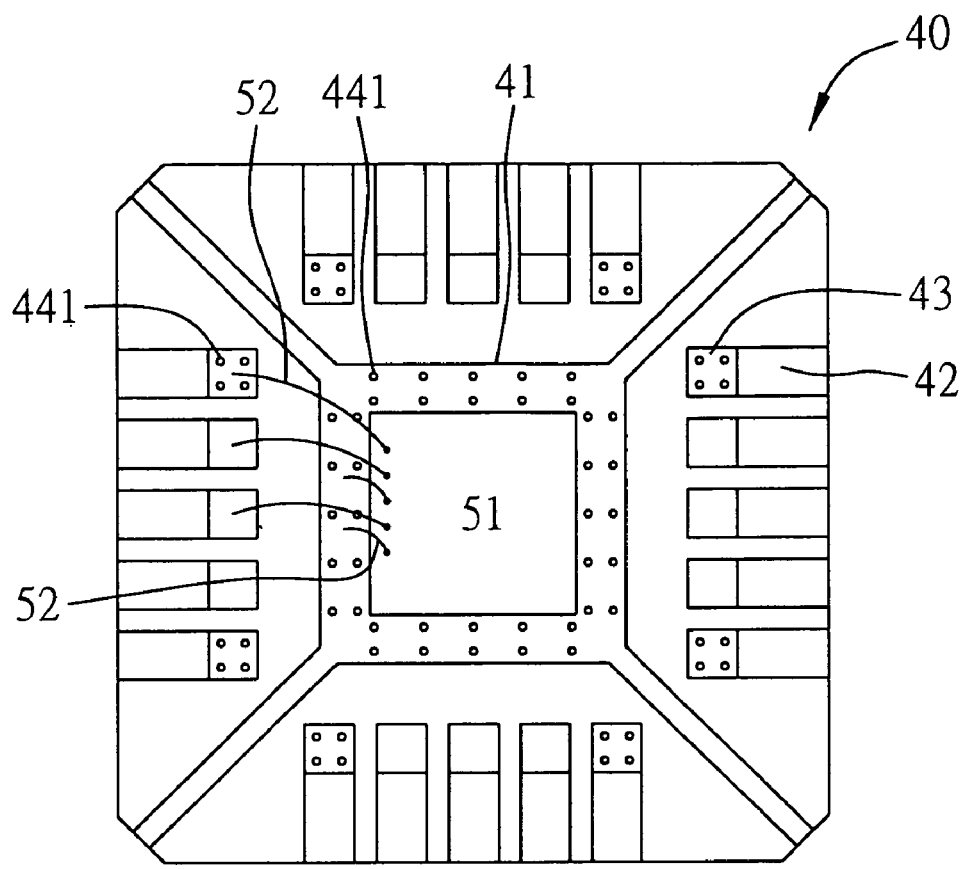
FIGS. 5A and 5B are schematic diagrams of a semiconductor package with the lead frame in accordance with the first preferred embodiment of the present invention.
Figure 5B:
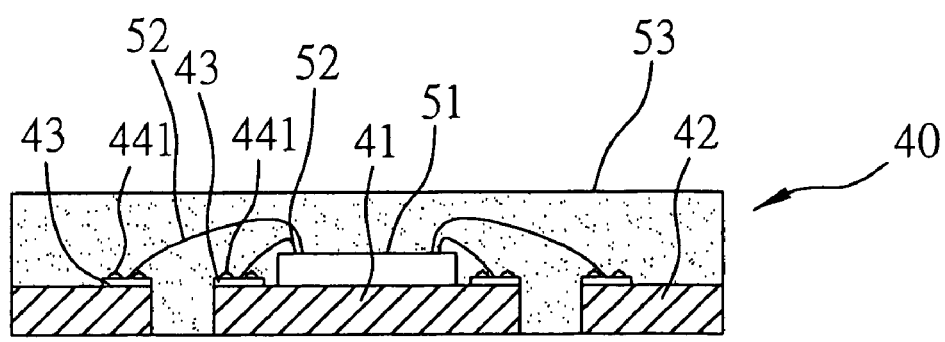

FIGS. 5A and 5B show a semiconductor package with the lead frame in accordance with the first preferred embodiment of the present invention. This semiconductor package comprises the lead frame 40 shown in FIGS. 4A and 4B. The lead frame 40 comprises a die pad 41, a plurality of leads 42 formed around the die pad 41, and a bonding layer 43 disposed on each of wire-bonding areas of the lead frame 40, wherein at least one embossed structure is formed on at least one of the bonding layers 43 at a position not for wire bonding and includes a metal bump 441 made of the same material as bonding wires. The semiconductor package further comprises at least one semiconductor chip 51 mounted on the die pad 41; a plurality of bonding wires 52 for electrically connecting the chip 51 to the bonding layers 43 of the wire-bonding areas of the lead frame 40; and an encapsulant 53 for encapsulating the chip 51, the bonding wires 52, and a portion of the lead frame 40.

The metal bump 441 can be in advance implanted on the bonding layer 43 of the wire-bonding area of the lead frame 40 by using a wire bonder. Then, the semiconductor chip 51 is attached to the die pad 41 of the lead frame 40, and a wire-bonding process is performed by the wire bonder to electrically connect the chip 51 to the lead frame 40 via the bonding wires 52. Alternatively, after the semiconductor chip 51 is mounted on the die pad 41 of the lead frame 40, the wire bonder is used to form the metal bump 441 on the bonding layer 43 of the wire-bonding area of the lead frame 40 and then perform the wire-bonding process to electrically connect the chip 51 to the wire-bonding areas free of the metal bump 441 via the bonding wires 52.

Figure 6A:
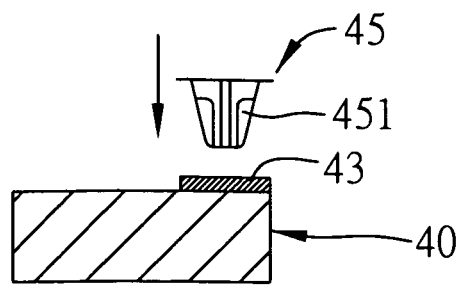
FIGS. 6A to 6C are schematic diagrams showing procedural steps for forming an embossed structure on the bonding layer of the lead frame in accordance with a second preferred embodiment of the present invention.
Figure 6B:
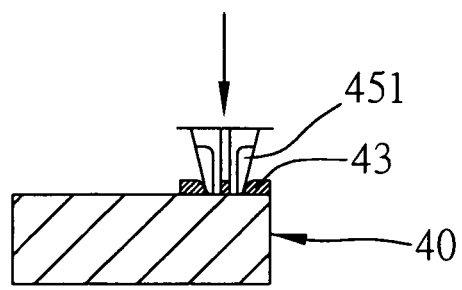
Figure 6C:
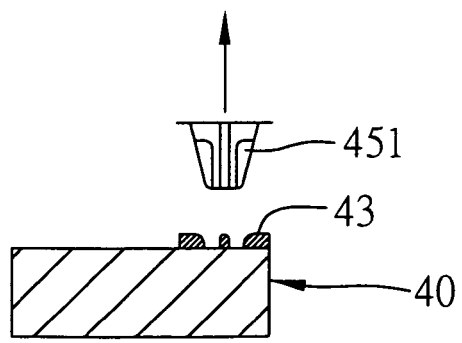

Referring to FIGS. 6A to 6C, the procedural steps for forming an embossed structure of a bonding layer of the lead frame in accordance with a second preferred embodiment of the present invention are provided. A wire bonder can be used to form at least one recessed portion in at least one of the bonding layers and optionally expose a portion of material of the lead frame via the recessed portion. In other words, a capillary of the wire bonder not containing any bonding wire is used to directly press the bonding layer downwardly to form the recessed portion in the bonding layer, and thus the embossed structure of the bonding layer is fabricated.

Figure 6D:
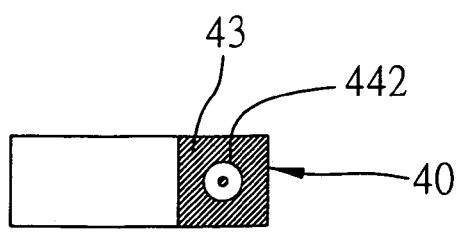
FIG. 6D is a schematic diagram showing a circular recessed portion being formed in the bonding layer of the wire-bonding area and exposing a portion of material of the lead frame in accordance with the present invention.

First referring to FIG. 6A, the wire bonder 45 without any bonding wire contained in its capillary 451 is placed above the bonding layer 43 of the lead frame 40. Then referring to FIG. 6B, the capillary 451 is moved to press the bonding layer 43 downwardly until reaching the lead frame 40. Subsequently referring to FIG. 6C, the capillary 451 is lifted and removed from the lead frame 40. Finally, as shown in FIG. 6D, at least one circular recessed portion 442 is formed, and a portion of material of the underneath lead frame 40 is exposed via the circular recessed portion 442. The circular recessed portion 442 forms an embossed structure of the bonding layer and desirably reinforces the adhesion between the lead frame and the encapsulant.

During the fabrication processes of a semiconductor package, the above lead frame having at least one recessed portion in advance formed in at least one of the bonding layers is prepared. Then, a semiconductor chip is mounted on a die pad of the lead frame. The wire bonder is used to perform a wire-bonding process for electrically connecting the chip to the lead frame via bonding wires. Finally, an encapsulant is fabricated and encapsulates the chip, the bonding wires, and a portion of the lead frame. Alternatively, after the semiconductor chip is mounted on the die pad, the wire bonder not containing any gold wire is used to form at least one recessed portion in at least one of the bonding layers of the wire-bonding areas of the lead frame. Then, the bonding wires are fabricated to electrically connect the chip to the wire-bonding areas at positions free of the recessed portion, prior to a molding process for forming the encapsulant.

Therefore, in the lead frame for improving molding reliability and the semiconductor package with the lead frame according to the present invention, embossed structures such as metal bumps or recessed portions are formed on bonding layers that are disposed on wire-bonding areas of the lead frame and where bonding wires are to be bonded. During a subsequent molding process for forming an encapsulant to encapsulate the chip, the bonding wires and a portion of the lead frame, the embossed structures of the bonding layers increase the contact area and adhesion between the bonding layers and the encapsulant, such that delamination between the bonding layers and the encapsulant and cracks of the bonding wires can be prevented, and the electrical performances and molding reliability are both improved. In addition, the present invention can avoid the problems such as reducing the rigidity of leads and causing difficulty in wire bonding and fabrication due to grooves or holes being formed on the leads of the lead frame in the prior art, and the present invention can also eliminate the drawbacks such as complicated fabrication processes and cracks of a neck portion of the bonding wire near the second bond (stitch bond) due to a stud bond being implanted on the second bond in the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A lead frame for improving molding reliability of a semiconductor package, comprising:
   a die pad;
   a plurality of leads formed around the die pad; and
   a bonding layer disposed on each of wire-bonding areas of the lead frame, wherein at least one embossed structure is formed on at least one of the bonding layers at a position not for wire bonding.

2. The lead frame of claim 1, wherein the embossed structure comprises a metal bump implanted on the bonding layer.

3. The lead frame of claim 1, wherein the embossed structure comprises a recessed portion formed in the bonding layer.

4. The lead frame of claim 1, wherein the wire-bonding areas of the lead frame include inner portions of the leads.

5. The lead frame of claim 1, wherein the wire-bonding areas of the lead frame include a peripheral portion of the die pad.

6. The lead frame of claim 1, wherein the lead frame is made of copper, and The bonding layer is made of silver or nickel/palladium.

7. The lead frame of claim 2, wherein the metal bump is implanted on the bonding layer by a wire bonder, so as to increase adhesion between the lead frame and an encapsulant in the semiconductor package via the metal bump.

8. The lead frame of claim 3, wherein the recessed portion is formed in the bonding layer by a wire bonder, so as to increase adhesion between the lead frame and an encapsulant in the semiconductor package via the recessed portion.

9. The lead frame of claim 8, wherein the recessed portion optionally exposes a portion of material of the lead frame.

10. A semiconductor package with a lead frame for improving molding reliability, comprising:
    the lead frame having a die pad and a plurality of leads formed around the die pad, wherein a bonding layer is disposed on each of wire-bonding areas of the lead frame, and at least one embossed structure is formed on at least one of the bonding layers at a position not for wire bonding;
    at least one semiconductor chip mounted on the die pad;
    a plurality of bonding wires for electrically connecting the semiconductor chip to the wire-bonding areas of the lead frame; and
    an encapsulant for encapsulating the semiconductor chip, the bonding wires, and a portion of the lead frame.

11. The semiconductor package of claim 10, wherein the embossed structure comprises a metal bump implanted on the bonding layer.

12. The semiconductor package of claim 10, wherein the embossed structure comprises a recessed portion formed in the bonding layer.

13. The semiconductor package of claim 10, wherein the wire-bonding areas of the lead frame include inner portions of the leads.

14. The semiconductor package of claim 10, wherein the wire-bonding areas of the lead frame include a peripheral portion of the die pad.

15. The semiconductor package of claim 10, wherein the lead frame is made of copper, and the bonding layer is made of silver or nickel/palladium.

16. The semiconductor package of claim 11, wherein the metal bump is implanted on the bonding layer by a wire bonder, so as to increase adhesion between the lead frame and the encapsulant via the metal bump.

17. The semiconductor package of claim 12, wherein the recessed portion is formed in the bonding layer by a wire bonder, so as to increase adhesion between die lead frame and the encapsulant via the recessed portion.

18. The semiconductor package of claim 17, wherein the recessed portion optionally exposes a portion of material of the lead frame.

19. The semiconductor package of claim 10, wherein the bonding wires are signal wires for electrically connecting the semiconductor chip to the leads of the lead frame.

20. The semiconductor package of claim 10, wherein the bonding wires are ground wires for electrically connecting the semiconductor chip to a grounding region that is located peripherally on the die pad of the lead frame and is free of being mounted with the chip.

* * * * *